(12) United States Patent
Tsai

(10) Patent No.: US 8,421,911 B2
(45) Date of Patent: Apr. 16, 2013

(54) IMAGE SENSOR MODULE AND CAMERA MODULE

(75) Inventor: Wen-Chin Tsai, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 311 days.

(21) Appl. No.: 12/958,405

(22) Filed: Dec. 2, 2010

(65) Prior Publication Data

US 2011/0304754 A1 Dec. 15, 2011

(51) Int. Cl.
*H04N 5/225* (2006.01)
*H01L 27/00* (2006.01)

(52) U.S. Cl.
USPC ............ 348/373; 348/374; 348/375; 348/376; 250/208.1

(58) Field of Classification Search .................. None
See application file for complete search history.

(56) References Cited

U.S. PATENT DOCUMENTS

| | | | | |
|---|---|---|---|---|
| 8,139,145 | B2* | 3/2012 | Ryu et al. ................ | 348/373 |
| 2005/0161587 | A1* | 7/2005 | Mihara et al. ............ | 250/214 R |
| 2005/0184352 | A1* | 8/2005 | Jeong et al. .............. | 257/432 |
| 2006/0091487 | A1* | 5/2006 | Hanada et al. ........... | 257/432 |
| 2009/0115891 | A1* | 5/2009 | Ryu et al. ................ | 348/374 |

* cited by examiner

*Primary Examiner* — Lin Ye
*Assistant Examiner* — John H Morehead, III
(74) *Attorney, Agent, or Firm* — Altis Law Group, Inc.

(57) ABSTRACT

An exemplary image sensor module includes a plate, an image sensor, and a number of conductive wires. The plate includes a top surface, a bottom surface, a light passing through hole, a number of spaced receiving holes extending through the top surface and the bottom surface, and a number of conductive pads on the top surface. The receiving holes surround the through hole. The sensor includes a first surface and a number of bonding pads corresponding to the respective conductive pads. The first surface opposes the bottom surface, and is mounted on the bottom surface. The first surface includes a light sensitive region aligned with the through hole, and a light insensitive region surrounding the light sensitive region. The bonding pads are arranged on the light insensitive region. The wires pass through the respective receiving holes, and respectively electrically connect the bonding pads to the corresponding conductive pads.

7 Claims, 4 Drawing Sheets

IMAGE SENSOR MODULE AND CAMERA MODULE

BACKGROUND

1. Technical Field

The present disclosure relates to optical imaging and, particularly, to an image sensor module, and a camera module having the image sensor module.

2. Description of Related Art

Image sensor modules having an image sensor are essential devices that have been widely used in camera modules.

A typical camera module includes an image sensor module, and a lens holder mounted on the image sensor module, having at least one lens received therein. The image sensor module includes a board, and an image sensor mounted on the board. A recess is defined in the surface of the board for receiving the image sensor. The image sensor includes bonding pads with conductive pads opposing the bonding pads, and electrically connecting the bonding pads to the board.

However, because the image sensor is received in a recess, the efficiency of heat dissipation of the image sensor is low. Accordingly, the image quality of the camera module is affected. In addition, if the conductive pads are not equal, there will be gaps between the lower conductive pads and the corresponding bonding pads. Therefore, the path for the current between the image sensor and the board is not complete. Accordingly, the camera module does not work well.

Therefore, it is desirable to provide a new image sensor module, and a camera module having the image sensor module, which can overcome the above mentioned limitations.

DETAILED DESCRIPTION

Embodiments will now be described in detail below with reference to drawings.

Figure 1:
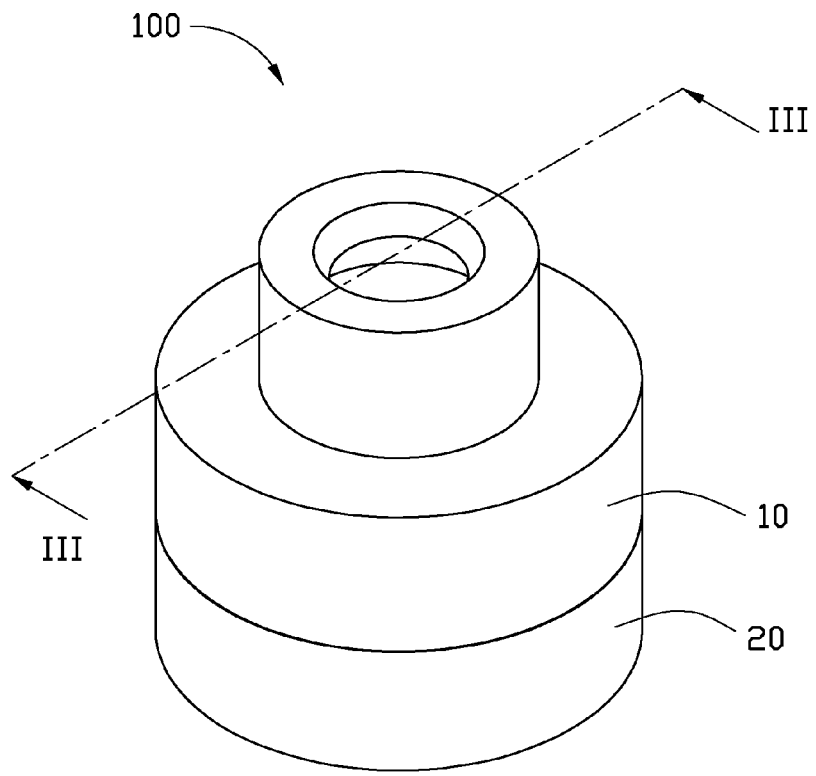
FIG. 1 is a schematic view of a camera module according to a first embodiment.
Figure 2:
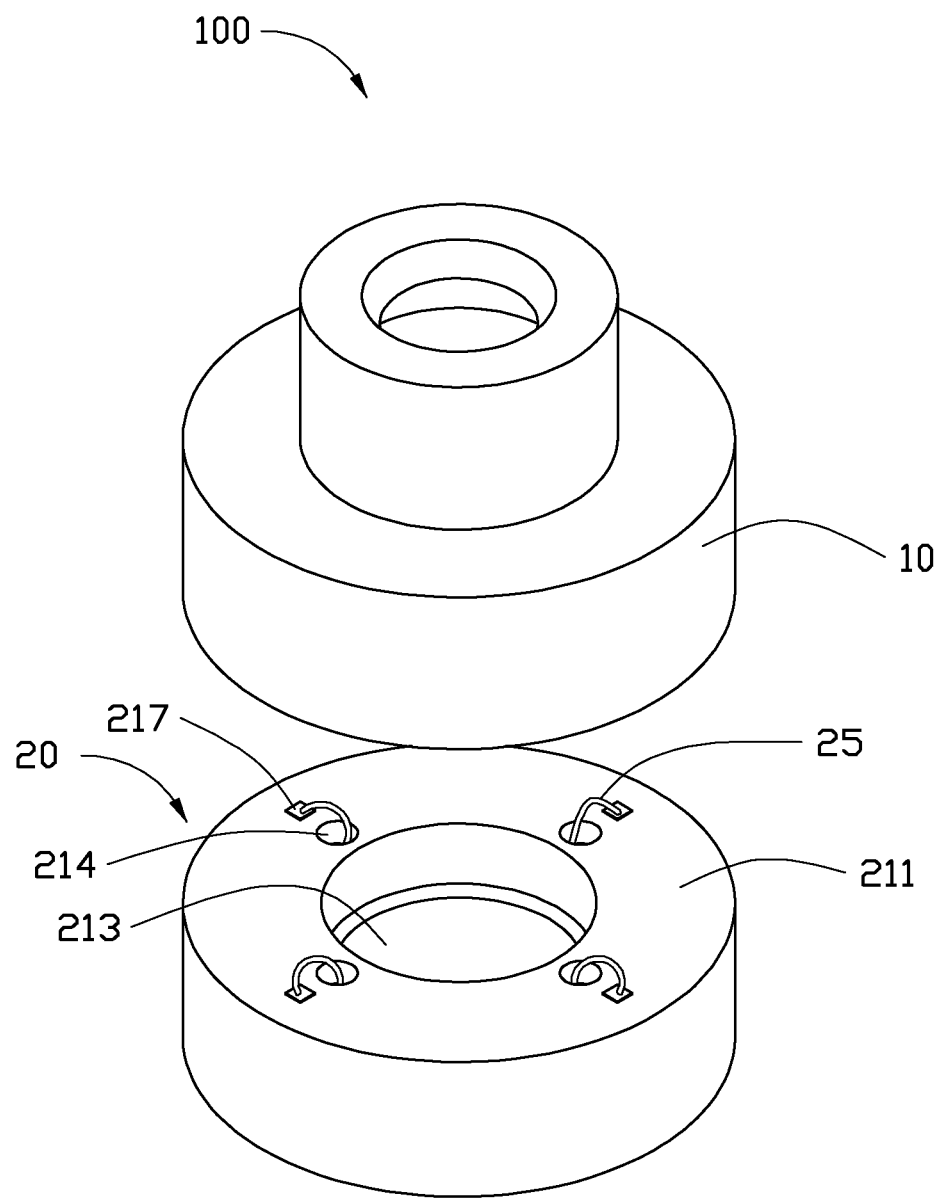
FIG. 2 is an exploded, schematic view of the camera module of FIG. 1.
Figure 3:
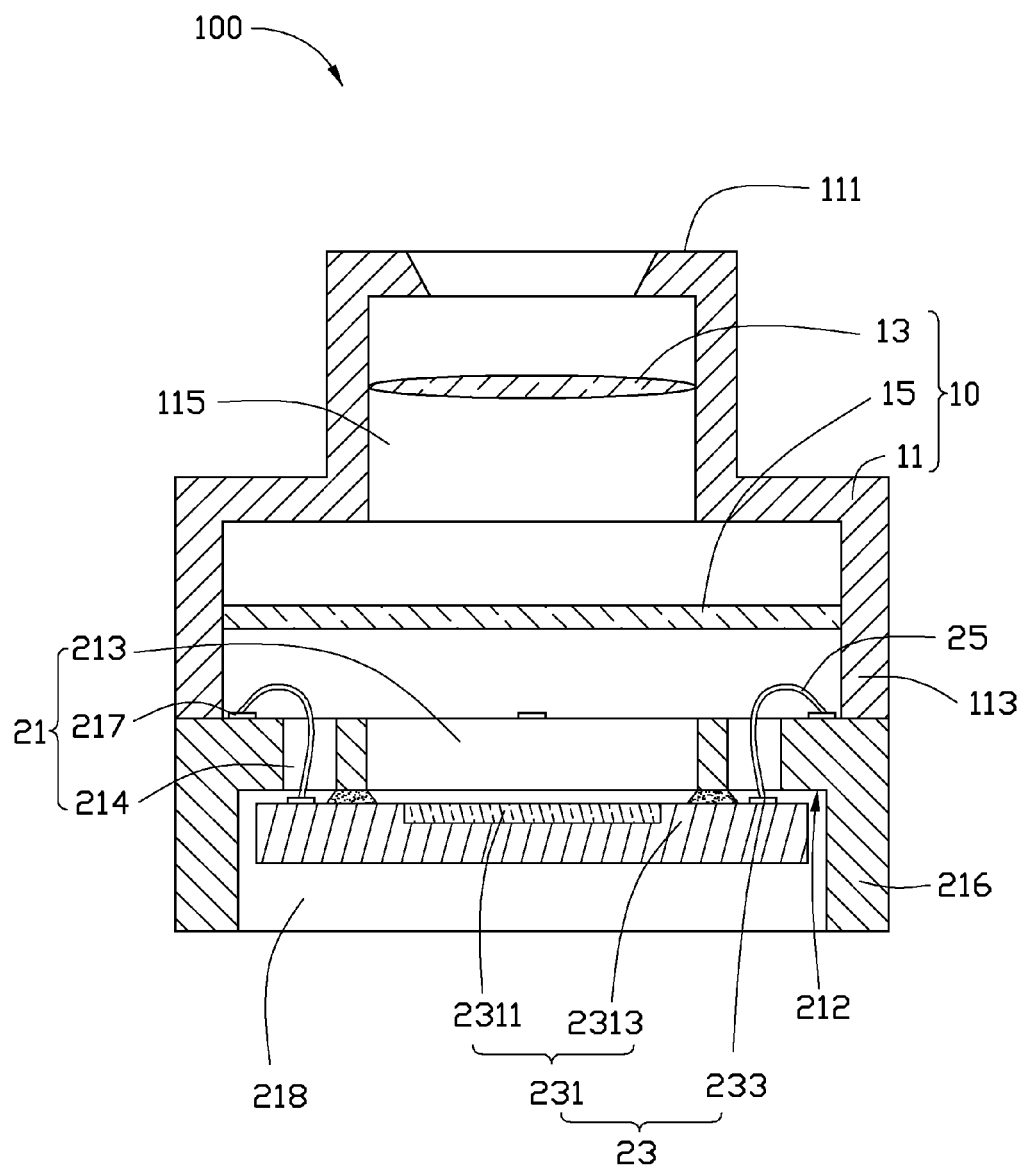
FIG. 3 is a sectional view of the camera module of FIG. 1, taken along line III-III.

Referring to FIGS. 1-3, a camera module 100, in accordance with a first embodiment, is shown. The camera module 100 includes a lens module 10, and an image sensor module 20 connected with the lens module 10.

The lens module 10 includes a lens holder 11, and at least one lens 13 received in the lens holder 11.

The lens holder 11 includes a top end 111, a bottom end 113 facing away from the top end 111, and a receiving cavity 115 extending through the top end 111 and the bottom end 113. The receiving cavity 115 receives the at least one lens 13. In the present embodiment, the end surface of the bottom end 113 is fixed on the image sensor module 20 with adhesive (not shown).

In the present embodiment, the lens module 10 further includes an optical filter 15 received in the receiving cavity 115. The filter 15 is arranged between the at least one lens 13 and the image sensor module 20 for selectively transmitting light having certain properties (often, a particular range of wavelengths, that is, range of colours of light), while blocking the remainder. In the present embodiment, the filter 15 is an infrared-cut filter. In alternative embodiments, the filter 15 may instead be an ultraviolet filter, or a low pass filter. In further alternative embodiments, the at least one lens 13 may be arranged between the filter 15 and the image sensor module 20. In still further alternative embodiments, the filter 15 may be arranged on the end surface of the top end 111.

The image sensor module 20 receives light from the lens module 10 and converts the light into electronic signals image data. The image sensor module 20 includes a plate 21, an image sensor 23, and a number of conductive wires 25 for electrically connecting the image sensor 23 to the plate 21.

The plate 21 may be made of ceramic, glass, plastic, laminate or other suitable material, and includes a top surface 211, a bottom surface 212 facing away from the top surface 211. A light, passing through hole 213 extends through the top surface 211 and the bottom surface 212. A number of spaced receiving holes 214 extend through the top surface 211 and he bottom surface 212. and a number of conductive pads 217 are arranged on the top surface 211. The receiving holes 214 surround the light passing through hole 213. The conductive pads 217 surround the receiving holes 213. That is, the receiving holes 214 are arranged between the conductive pads 217 and the light passing through hole 213.

In the present embodiment, the plate 21 further includes a side wall 216 extending down from a periphery of the bottom surface 212. A receiving portion 218 receiving the image sensor 23 is cooperatively defined by the bottom surface 212 and the side wall 216. The top surface 211 supports the bottom end 113 of the lens holder 11.

The image sensor 23 received in the receiving portion 218 is a photosensitive element responsive to infrared radiation, ultraviolet radiation, or visible light beams and converts the light into electronic signals. The image sensor 23 includes a first surface 231, and a number of bonding pads 233 arranged on the first surface 231. The bonding pads 233 correspond to the respective conductive pads 217.

The first surface 231 includes a light sensitive region 2311, and a light insensitive region 2313 surrounding the light sensitive region 2311. The light sensitive region 2311 aligns with the light passing through bole 213. The light sensitive region 2311 receives light from the at least one lens 13, and converts light signals into electronic signals. The light insensitive region 2313 opposes the bottom surface 212, and is engaged with portion of the bottom surface 212 located between the light passing through hole 213 and the receiving holes 214.

The bonding pads 233 are arranged on the light insensitive region 2313 for electrically connecting the image sensor 23 to the conductive pads 217 of the plate 21.

The conductive wires 25 pass through the respective receiving holes 214, and respectively electrically connect the bonding pads 233 to the corresponding conductive pads 217.

Because the image sensor 23 is exposed to outside, the efficiency of heat dissipation can be improved. Therefore, the image quality of the camera module 100 can improve. In addition, the conductive wires 25 respectively electrically connect the bonding pads 233 to the corresponding conductive pads 217. Therefore, the open circuit caused by different heights of the conductive pads 217 can be avoided.

Figure 4:
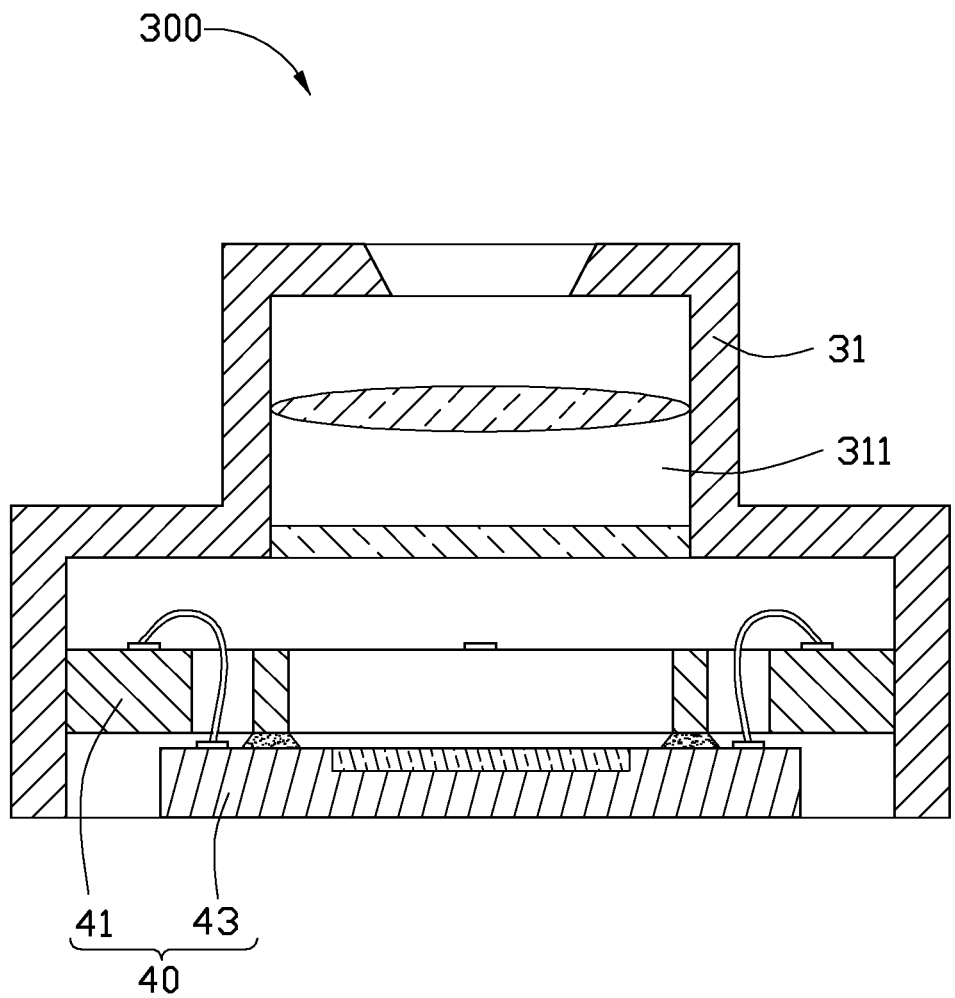
FIG. 4 is a schematic view of a camera module according to a second embodiment.

Referring to FIG. 4, a camera module 300, in accordance with a second embodiment, is shown. The camera module 300 includes a lens holder 31 having a receiving cavity 311, and an image sensor module 40 connected with the lens module 30.

The image sensor module 40 is similar to the image sensor module 20, and includes a plate 41 and an image sensor 43 electrically connected to the plate 41. A peripheral wall of the plate 11 contacts an inner surface of the lens holder 31 in the receiving cavity 311. The image sensor 43 is mounted on the bottom surface of the plate 41 and is received in the receiving cavity 311.

While certain embodiments have been described and exemplified above, various other embodiments will be apparent to those skilled in the art from the foregoing disclosure. The disclosure is not limited to the particular embodiments described and exemplified but is capable of considerable variation and modification without departure from the scope and spirit of the appended claims.

What is claimed is:

1. An image sensor module comprising:
   a plate, the plate comprising a top surface, a bottom surface facing away from the top surface, a light passing through hole extending through the top surface and the bottom surface, a plurality of spaced receiving holes extending through the top surface and the bottom surface, and a plurality of conductive pads arranged on the top surface, the receiving holes surrounding the light passing through hole, the conductive pads surrounding the receiving holes, the plate further comprising a sidewall extending down from a periphery of the bottom surface, the sidewall and the bottom surface cooperatively defining a receiving portion receiving the image sensor;
   an image sensor, the image sensor comprising a first surface and a plurality of bonding pads corresponding to the respective conductive pads, the first surface opposing the bottom surface of the plate and mounted on the bottom surface of the plate, the first surface comprising a light sensitive region aligned with the light passing through hole, and a light insensitive region surrounding the light sensitive region, the bonding pads arranged on the light insensitive region, and
   a plurality of conductive wires, the conductive wires passing through the respective receiving holes, and respectively electrically connecting the bonding pads to the corresponding conductive pads.

2. The image sensor module of claim 1, wherein the light insensitive region is fixed on the bottom surface of the plate with adhesive.

3. The image sensor module of claim 1, wherein the light insensitive region is engaged with portion of the bottom surface located between the light passing through hole and the receiving holes.

4. A camera module comprising:
   a lens module having at least one lens, wherein the lens module comprises a lens holder, the lens holder comprises a top end, a bottom end, and a receiving cavity extending through the top end and the bottom end, the receiving cavity receiving the at least one lens therein, and
   an image sensor module connected with the lens module, the image sensor module comprising:
   a plate comprising a top surface, a bottom surface facing away from the top surface, a light passing through hole extending through the top surface and the bottom surface, a plurality of spaced receiving holes extending through the top surface and the bottom surface, and a plurality of conductive pads arranged on the top surface, the receiving holes surrounding the light, passing through hole, the top surface of the plate being fixed on the end surface of the bottom end, the conductive pads surrounding the receiving holes, the plate further comprising a sidewall extending down from a periphery of the bottom surface, the sidewall and the bottom surface cooperatively defining a receiving portion receiving the image sensor;
   an image sensor, the image sensor comprising a first surface and a plurality of bonding pads corresponding to the respective conductive pads, the first surface opposing the bottom surface of the plate and attached on the bottom surface, the first surface comprising a light sensitive region aligned with the light passing through hole, and a light insensitive region surrounding the light sensitive region, the light sensitive region being configured for receiving light from the at least one lens, and converting the light into electronic signals, the bonding pads arranged on the light insensitive region, and
   a plurality of conductive wires, the conductive wires passing through the respective receiving holes, and respectively electrically connecting the bonding pads to the corresponding conductive pads.

5. The camera module of claim 4, further comprising an optical filter received in the receiving cavity.

6. The camera module of claim 5, wherein the optical filter is located between the at least one lens and the image sensor module.

7. The camera module of claim 5, wherein the at least one lens is located between the optical filter and the image sensor module.

* * * * *